(12) United States Patent
Cho

(10) Patent No.: US 8,461,008 B2
(45) Date of Patent: Jun. 11, 2013

(54) METHODS FOR FABRICATING FINFET INTEGRATED CIRCUITS IN BULK SEMICONDUCTOR SUBSTRATES

(75) Inventor: Jin Cho, Palo Alto, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 11 days.

(21) Appl. No.: 13/210,086

(22) Filed: Aug. 15, 2011

(65) Prior Publication Data

US 2013/0045580 A1 Feb. 21, 2013

(51) Int. Cl.
*H01L 21/336* (2006.01)

(52) U.S. Cl.
USPC ............................ 438/296; 438/424; 257/401

(58) Field of Classification Search
USPC ...................... 438/296, 424; 257/401, E27.06
See application file for complete search history.

(56) References Cited

U.S. PATENT DOCUMENTS

| | | | |
|---|---|---|---|
| 2007/0004113 A1* | 1/2007 | King et al. | 438/197 |
| 2007/0120156 A1* | 5/2007 | Liu et al. | 257/288 |
| 2007/0132053 A1* | 6/2007 | King et al. | 257/499 |
| 2012/0049294 A1* | 3/2012 | Chen et al. | 257/401 |
| 2012/0091511 A1* | 4/2012 | Chen et al. | 257/213 |

* cited by examiner

*Primary Examiner* — Jarrett Stark
*Assistant Examiner* — John M Parker
(74) *Attorney, Agent, or Firm* — Ingrassia Fisher & Lorenz, P.C.

(57) ABSTRACT

Methods are provided for fabricating FinFETs that avoid thickness uniformity problems across a die or a substrate. One method includes providing a semiconductor substrate divided into a plurality of chips, each chip bounded by scribe lines. The substrate is etched to form a plurality of fins, each of the fins extending uniformly across the width of the chips. An oxide is deposited to fill between the fins and is etched to recess the top of the oxide below the top of the fins. An isolation hard mask is deposited and patterned overlying the plurality of fins and is used as an etch mask to etch trenches in the substrate defining a plurality of active areas, each of the plurality of active areas including at least a portion of at least one of the fins. The trenches are filled with an insulating material to isolate between adjacent active areas.

20 Claims, 5 Drawing Sheets

METHODS FOR FABRICATING FINFET INTEGRATED CIRCUITS IN BULK SEMICONDUCTOR SUBSTRATES

TECHNICAL FIELD

The present invention generally relates to methods for fabricating integrated circuits, and more particularly relates to methods for manufacturing FinFET integrated circuits in bulk semiconductor substrates that avoid thickness uniformity problems.

BACKGROUND

Transistors such as metal oxide semiconductor field effect transistors (MOSFETs) or simply field effect transistors (FETs) are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FinFET is a type of transistor that lends itself to the dual goals of reducing transistor size while maintaining transistor performance. The FinFET is a three dimensional transistor formed in a thin fin that extends upwardly from a semiconductor substrate. Transistor performance, often measured by its transconductance, is proportional to the width of the transistor channel. In a FinFET the transistor channel is formed along the vertical sidewalls of the fin, so a wide channel, and hence high performance, can be achieved without substantially increasing the area of the substrate surface required by the transistor.

FinFET ICs have traditionally been fabricated using semiconductor on insulator (SOI) substrates. There are significant advantages, however, to fabricating FinFET ICs on a bulk semiconductor substrate, including the significantly lower cost and higher crystalline quality of a bulk semiconductor substrate compared to a SOI substrate. Some problems that are easily solved when using SOI substrates must be addressed when fabricating FinFET ICs on a bulk semiconductor substrate. One of those problems involves isolation between adjacent fins and between adjacent active areas. When using a SOI substrate, isolation between fins is achieved by etching away all of the semiconductor material between the fins, leaving the fins extending upwardly from the underlying insulating material. Fabrication of FinFET ICs on bulk semiconductor substrates, however, requires two different types of insulator filled trenches. Shallow insulator filled trenches provide isolation between fins, and deep insulator filled trenches provide isolation between active areas. The shallow trenches are usually narrow and high density while the deep trenches tend to be wide and low density. The combination of the two types of isolation trenches, one shallow, narrow and dense, the other deep, wide, and low density, creates problems with planarization and etch processing steps. "Dishing" tends to occur over and adjacent to the low density regions during etch or planarization. The dishing leads to non-planar surfaces and to variation in fin height. The variation in fin height, in turn, results in non-uniformity of channel width and FinFET characteristics.

Accordingly, it is desirable to provide methods for fabricating FinFET integrated circuits that provide the necessary isolation uniformly across a semiconductor substrate. In addition, it is desirable to provide methods for fabricating FinFET ICs in bulk semiconductor substrates that avoid insulator non-uniformity. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating FinFETs that avoid thickness uniformity problems across a die or a substrate. One embodiment includes providing a semiconductor substrate divided into a plurality of chips, each chip bounded by scribe lines. The substrate is etched to form a plurality of fins, each of the fins extending uniformly across the width of the chips. An oxide is deposited to fill between the fins and is etched to recess the top of the oxide below the top of the fins. An isolation hard mask is deposited and patterned overlying the plurality of fins and is used as an etch mask to etch trenches in the substrate defining a plurality of active areas, each of the plurality of active areas including at least a portion of at least one of the fins. The trenches are filled with an insulating material to isolate between adjacent active areas.

In accordance with another embodiment the method for fabricating a FinFET integrated circuit includes providing a semiconductor substrate that is divided into a plurality of chip areas. The semiconductor substrate is etched to form a plurality of fins extending across each chip area and isolation is formed between adjacent ones of the plurality of fins. The semiconductor substrate is etched through the plurality of fins and into the substrate to form trenches in the substrate and to divide the plurality of fins into fins of predetermined length. The trenches are filled with insulating material.

In accordance with yet another embodiment the method for fabricating a FinFET integrated circuit includes providing a silicon substrate divided into a plurality of chip areas. The silicon substrate is etched to form a uniform array of fins extending across each of the chip areas. A layer of oxide is deposited overlying the array of fins and is planarized. The silicon substrate and the uniform array of fins are etched to define a plurality of active areas, each active area including at least a portion of a fin of the uniform array of fins. Isolation is formed between the active areas.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
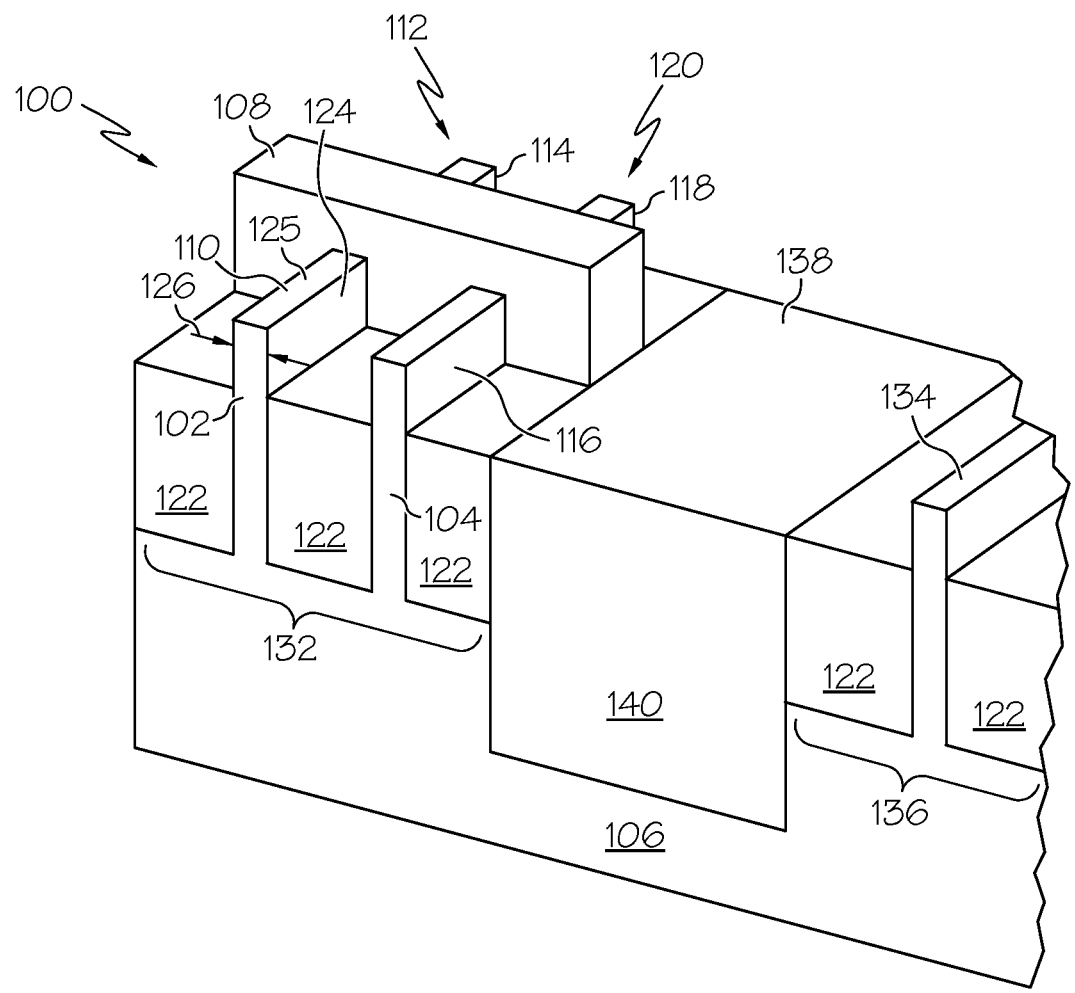
FIG. 1 illustrates, in cut away perspective view, a portion of a FinFET integrated circuit fabricated in accordance with various embodiments.

FIG. 1 illustrates, in a cut away perspective view, a portion of a FinFET integrated circuit (IC) 100. The illustrated portion of IC 100 includes two fins 102 and 104 that are formed from and extend upwardly from a bulk semiconductor substrate 106. Fins 102 and 104 are located in active area 132. A gate electrode 108 overlies the two fins and is electrically insulated from the fins by a gate insulator (not illustrated). End 110 of fin 102 is appropriately impurity doped to form the source of a FinFET 112 and end 114 of that fin is appropriately impurity doped to form the drain of the FinFET. Similarly, ends 116 and 118 of fin 104 form the source and drain, respectively, of another FinFET 120. Active area 132 thus includes two FinFETs 112 and 120 having a common gate electrode. In another configuration, if source 110 and 116 are electrically coupled together and drains 114 and 118 are electrically coupled together the structure would be a two-fin FinFET having twice the gate width of either FinFET 112 or 120. Oxide layer 122 forms electrical isolation between fins 102 and 104. The channel of FinFET 112 extends along the sidewall 124 of fin 102 beneath gate electrode 108 as well as along the opposite sidewall not visible in this perspective view. The advantage of the FinFET structure is that although the fin has only the narrow width represented by the arrows 126, the channel has a width represented by at least twice the height of the fin above oxide 122. The channel width thus can be much greater than fin width. The illustrated portion of IC 100 also includes fin 134 that extends upwardly from semiconductor substrate 106 in active area 136. Deep trench isolation region 138, filled with an insulating material 140 provides electrical isolation between active areas 132 and 136 as required by the circuit being implemented. FinFET IC 100 may include a large number of active areas similar to active areas 132 and 134. Each active area may include a single FinFET, a plurality of FinFETs, a logic gate, buffer, memory array, or other circuit implementation.

In conventional processing it is difficult to control uniformity of thickness of oxide layer 122 and insulating material 140. Failure to control the thicknesses leads to variability in the height of the active fins, that is, the portion of the fins above oxide 122 and, accordingly, channel width. Lack of uniformity is especially problematic in oxide layers 122 and fins adjacent to areas such as deep trench isolation areas in which the density of fins is low or non-uniform.

Figure 2:
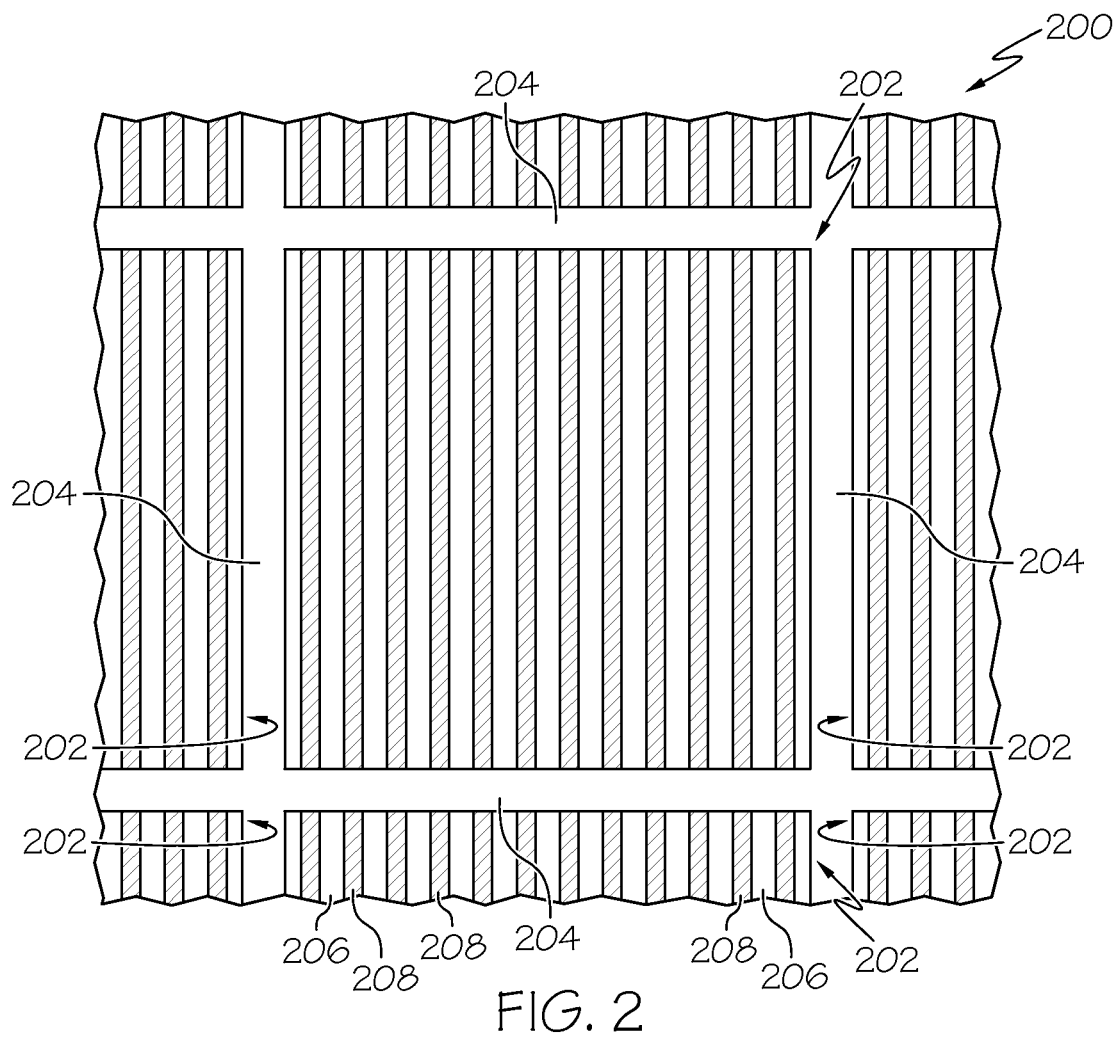
FIG. 2 illustrates, in plan view, a portion of a semiconductor substrate in and on which FinFET ICs are fabricated in accordance with various embodiments.

FIG. 2 illustrates, in plan view, a portion of a semiconductor substrate 200 in and on which FinFET ICs such as FinFET IC 100 are fabricated in accordance with various embodiments to be described below. Semiconductor substrate 200 is a bulk semiconductor substrate formed of a monocrystalline semiconductor material such as silicon, silicon admixed with germanium, carbon or other element(s) or other semiconductor material commonly used in the fabrication of integrated circuits. Semiconductor substrate 200 is divided into a plurality of chips 202. A FinFET IC is to be fabricated in and on each of the chips. Chips 202 are bounded by scribe lines 204. At the completion of the IC fabrication the chips will be separated by scribing, sawing, or laser cutting along the scribe lines. The scribe lines are also used as locations for alignment marks, test structures, and the like. In accordance with an embodiment, semiconductor substrate 200 is etched to form a plurality of trenches 206. The trenches delineate a plurality of fins 208 that form a uniform array extending substantially across each of the chips from scribe line to scribe line.

FIGS. 3-11 illustrate, in cross section, method steps in accordance with various embodiments for forming FinFET ICs 100 in and on chips 202 on semiconductor substrate 200. Only a portion of the FinFET IC 100 is illustrated in the FIGURES. Various steps in the manufacture of ICs are well known to those of skill in the art and so, in the interest of brevity, many conventional steps will only be mentioned briefly herein or will be omitted entirely without providing the well known process details.

Figure 3:
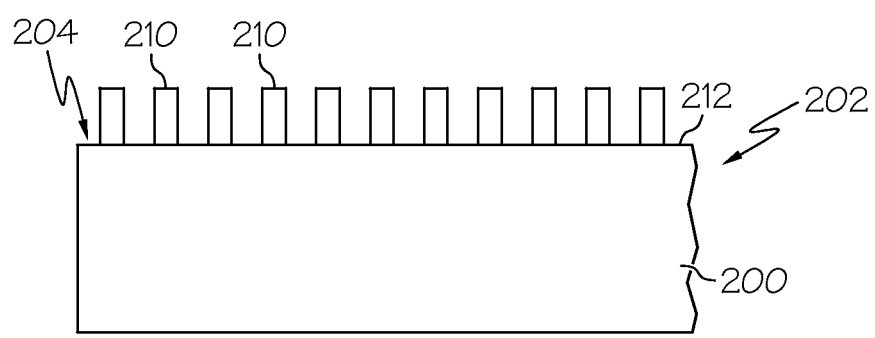
FIGS. 3-11 illustrate, in cross section, method steps in accordance with various embodiments for forming FinFET ICs.

As illustrated in FIG. 3, the method in accordance with one embodiment begins by providing semiconductor substrate 200. As discussed above, semiconductor substrate 200 can be any of the semiconductor materials commonly used in the fabrication of integrated circuits, but for ease of discussion but without limitation will be assumed to be a silicon substrate. Substrate 200 is divided into a plurality of chips 202 bounded by scribe lines 204, of which only a portion of one chip is illustrated. A hard mask 210 is formed overlying surface 212 of the substrate. The hard mask is formed by depositing a layer of hard mask material and photolithographically patterning and etching the layer to form a mask having a plurality of lines of substantially uniform pitch and spacing. Hard mask 210 can be, for example, a patterned layer of silicon nitride having a thickness of, for example, 10-50 nanometers (nm). The hard mask extends from scribe line 204 on the left edge of chip substantially completely across the chip to the opposite scribe line (not illustrated). The hard mask also extends substantially from scribe line to scribe line into and out of the plane of the FIGURE.

Figure 4:
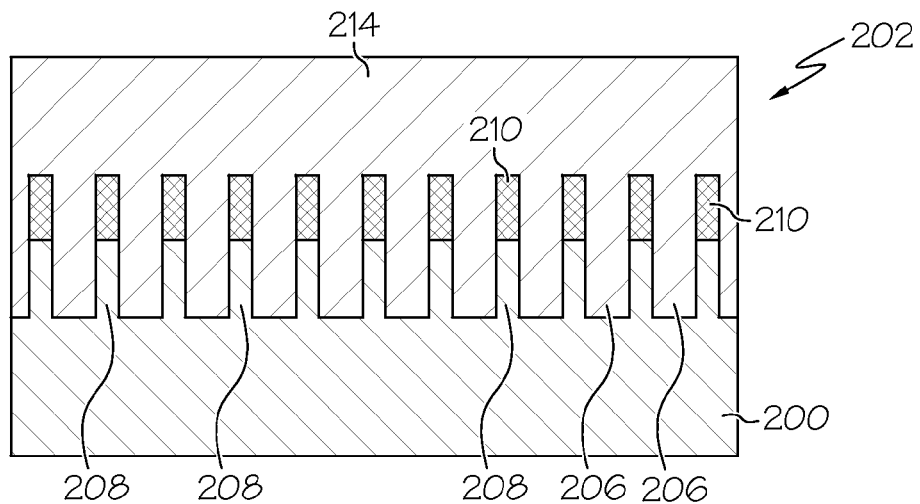

As illustrated in FIG. 4, the hard mask is used as an etch mask and a plurality of trenches 206 are etched into semiconductor substrate 200 to form a plurality of fins 208 in an array of fins that extend substantially across the entirety of the chip from scribe line to scribe line. The trenches are anisotropically etched, for example by reactive ion etching (RIE) to a depth of, for example, 40-100 nm. Fins 208 can have a width of, for example 10-20 nm and a pitch of 40-60 nm. Actual trench depth, fin width, and pitch will be determined by the requirements of the circuit being implemented. The length of the fins is substantially from scribe line to scribe line into and out of the plane of the FIGURE. Following the etching of trenches 206, a layer of insulating material 214, preferably a layer of silicon oxide, is deposited to fill the trenches and to cover the fins and hard mask.

Figure 5:
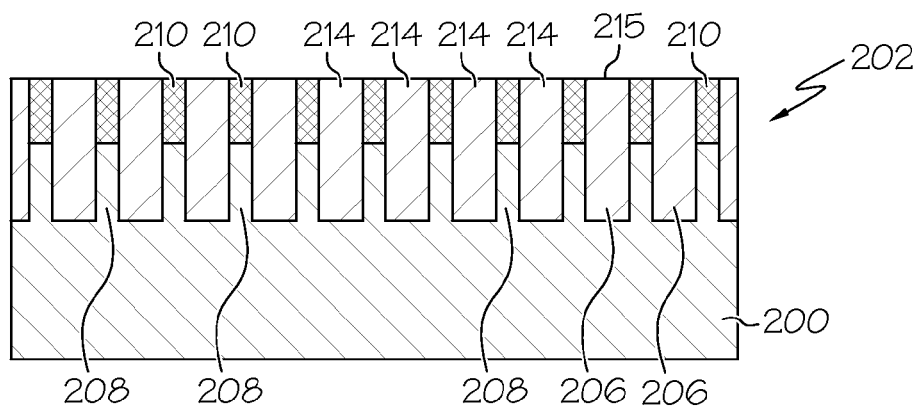

The top surface of the layer of insulator is planarized, for example by chemical mechanical planarization (CMP). The hard mask can be used as a stop for the planarization as illustrated in FIG. 5. The planarization can be accomplished uniformly across the substrate to form a planar surface 215 because of the substantially uniform density of fins and hard mask.

Figure 6:
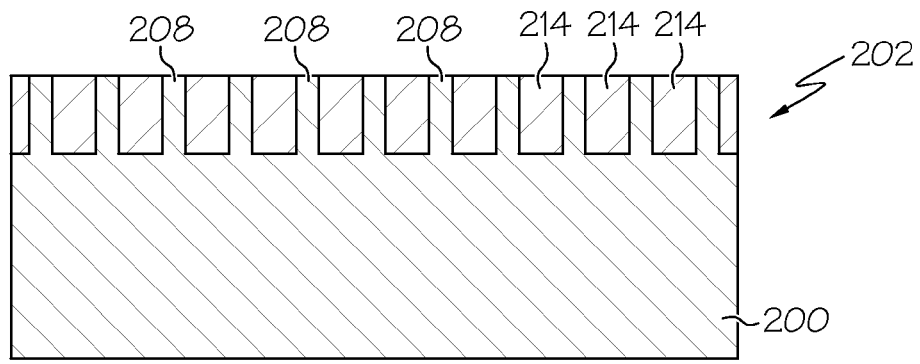

The structure illustrated in FIG. 5 can be further planarized, in accordance with one embodiment, to remove the hard mask and to remove any material above the level of the top of the fins as illustrated in FIG. 6. This further planarization can be accomplished by, for example, either CMP or a dry plasma etch. Again, the planarization can be accomplished uniformly across the substrate because of the substantially uniform density of structures to be etched or planarized so that the resulting height of the remaining fins is uniform across the chip and across the substrate.

Figure 7:
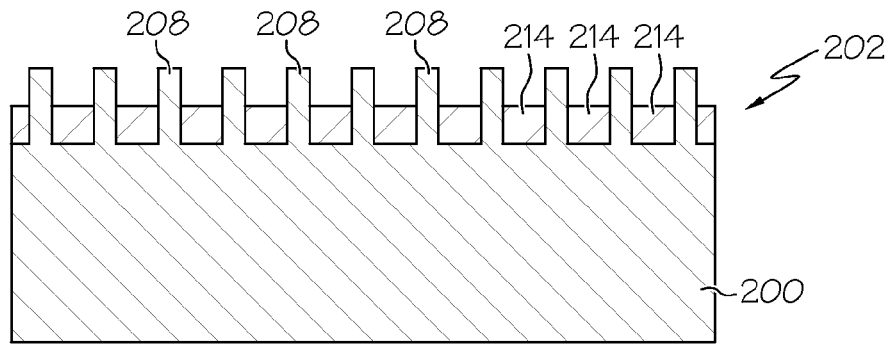

As illustrated in FIG. 7, the method continues, in accordance with one embodiment, by etching the layer of insulating material 214 to recess the insulating material and to expose an upper portion of fins 208. The insulating material is etched to expose about 10-30 nm of the top portion of the fins. The insulating material can be etched in a dilute hydrogen fluoride (HF) solution or by an isotropic dry etch solution. The insulating material can be etched uniformly across the chip and across the entire substrate because the etching environment is uniform across the entire substrate due to the uniform array of fins extending substantially entirely across each chip.

Figure 8:
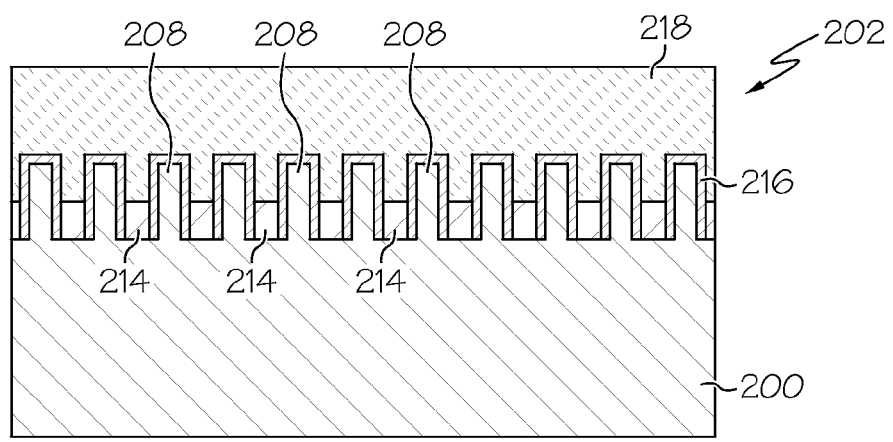

In accordance with one embodiment, as illustrated in FIG. 8, substrate 200 is thermally oxidized to grow a thin layer of silicon dioxide 216 on the top and edges of fins 208 and on the surface of semiconductor substrate 200. Alternatively, the thin layer of oxide can be deposited, for example by chemical vapor deposition. The thin layer of silicon dioxide can have a thickness, for example, of 1-5 nm. A layer of silicon nitride or other hard mask material 218 is deposited overlying the thin layer of silicon dioxide.

Figure 9:
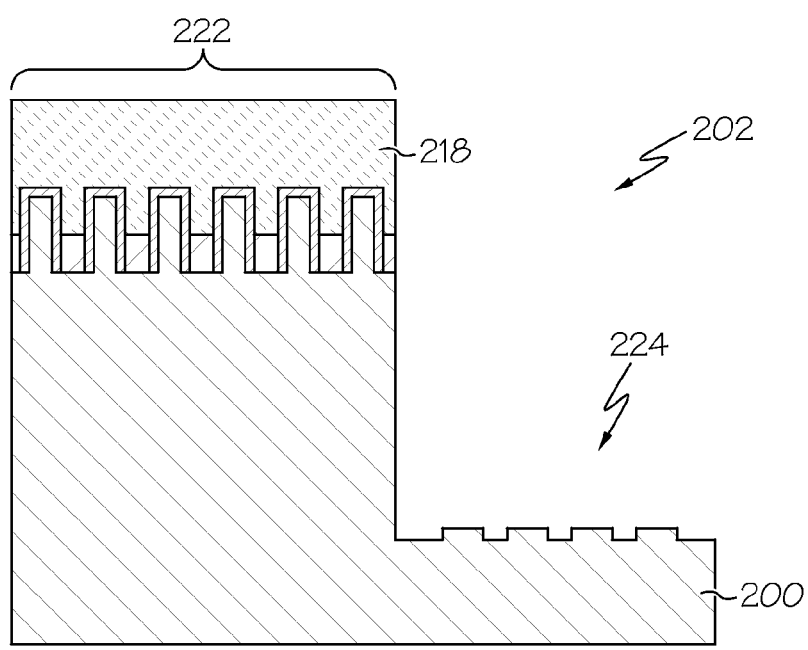

Hard mask material 218 is patterned as illustrated in FIG. 9 with the remaining portion of the hard mask material forming an etch mask. The etch mask is used to protect active areas of the semiconductor substrate such as active area 222, and deep trenches 224 (only one deep trench is illustrated) are anisotropically etched through exposed fins 208 and into substrate 200 to define a plurality of active areas in the substrate and to divide the fins into fins of predetermined length. Each of the plurality of active areas includes at least a portion of at least one of the fins. The deep trenches can be etched, for example by RIE to a depth of 150-250 nm.

Figure 10:
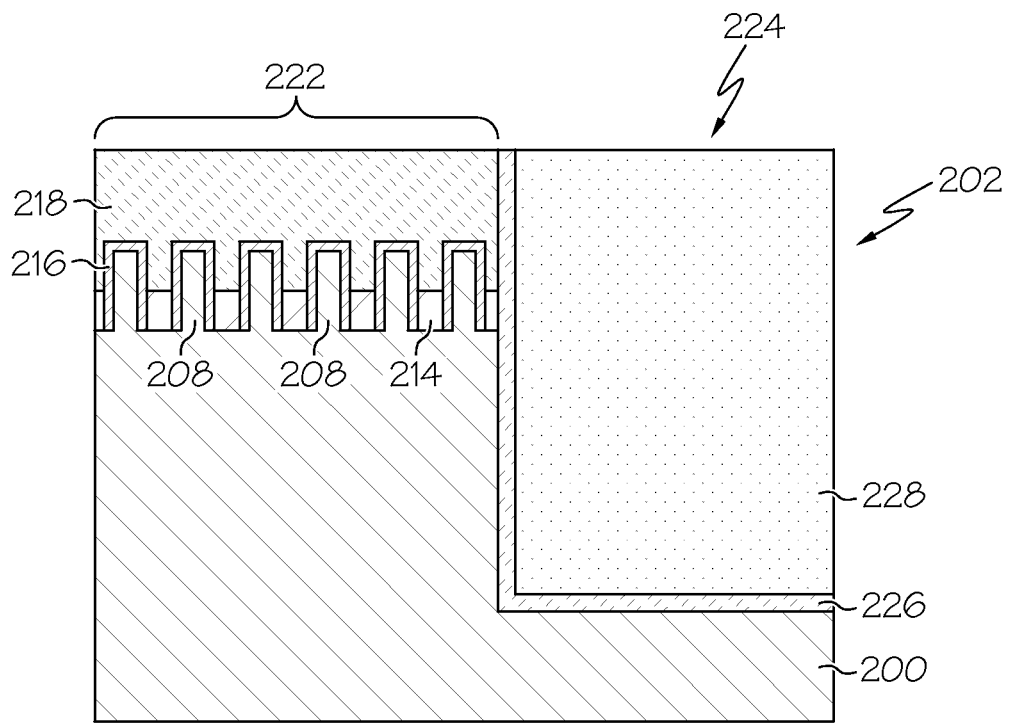

The method continues, in accordance with one embodiment, as illustrated in FIG. 10, by the deposition of a trench liner 226 such as a layer of silicon nitride followed by the deposition of a trench fill material 228 such as a silicon oxide to form electrical isolation between the active areas. The trench fill material is planarized, for example by CMP, using hard mask material 218 as a polish stop.

Figure 11:
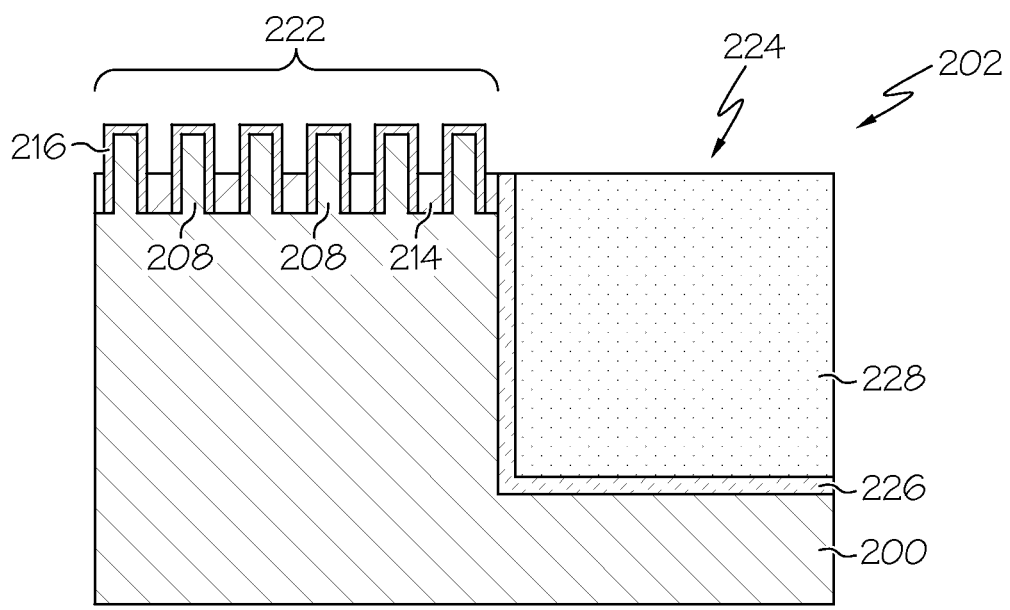

As illustrated in FIG. 11 the planarized trench fill material is etched, for example with a wet etch chemistry, to recess the top of the trench fill material to approximately the same height as the top of recessed silicon oxide layer 214. The remainder of the layer of hard mask material is removed after recessing the trench fill material. If the hard mask material is silicon nitride, it can be removed by etching in hot phosphoric acid. After removing the remaining hard mask material, semiconductor chip 202 includes a plurality of active areas 222 electrically isolated by insulator-filled deep trenches 224. Each of the active areas includes one or more fins 208 extending upwardly from semiconductor substrate 200. A layer of silicon oxide 214 provides isolation between adjacent ones of the fins in any one of the active areas. Because of the way the fins were formed in a regular array extending across substantially the entire width of the semiconductor chip, the fins are of substantially identical height. Additionally, because the array of fins was of substantially uniform density across the semiconductor chip, silicon oxide 214 was able to be planarized and recess etched to a uniform depth across the chip. The height of the fins extending above the recessed oxide 214, which determines the width of the channel of each of the FinFETs of IC being fabricated, are thus uniform across the chip.

Although not illustrated in the FIGURES, the fins within any of the active areas can be etched to divide the fins into lengths needed to form the FinFETs required to implement the integrated circuit being fabricated. Fabrication of the IC then proceeds in conventional manner to form the necessary transistor elements. For example, gate structures including a gate insulator and a gate electrode similar to gate electrode 108 illustrated in FIG. 1 are formed overlying fins 208. The gate structures can be formed by either gate first techniques or by replacement gate techniques, both of which are well known to those of skill in the art. Similarly, source and drain regions similar to those illustrated in FIG. 1 can be formed by impurity doping portions of the fins in self alignment with the gate structures. The source and drain regions can be formed by ion implantation, plasma doping, or the like. Middle of the line and back end of the line processing can then proceed in normal manner.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating a FinFET integrated circuit comprising:
   providing a semiconductor substrate divided into a plurality of chips, each chip bounded by scribe lines;
   etching the semiconductor substrate to form a plurality of fins, each of the plurality of fins extending across the width of the chips substantially to the scribe lines;
   depositing an oxide to fill between the fins;
   etching the oxide to recess the oxide;
   oxidizing the plurality of fins;
   depositing and patterning an isolation hard mask overlying the plurality of fins;
   etching the semiconductor substrate using the isolation hard mask as an etch mask to form trenches in the semiconductor substrate defining a plurality of active areas, each of the plurality of active areas including at least a portion of at least one of the fins; and
   filling the trenches with an insulating material to isolate between adjacent ones of the plurality of active areas,
   wherein oxidizing the plurality of fins is performed after etching the oxide and before depositing and patterning an isolation hard mask.

2. The method of claim 1 wherein etching the semiconductor substrate comprises:
   depositing and patterning a layer of hard mask material to form a plurality of hard mask lines having substantially uniform pitch and spacing;
   anisotropically etching the semiconductor substrate using plurality of hard mask lines as an etch mask to form the plurality of fins.

3. The method of claim 2 wherein depositing an oxide comprises:
   depositing a layer of oxide overlying the plurality of hard mask lines and the plurality of fins and filling between the plurality of fins;
   planarizing the layer of oxide using the plurality of hard mask lines as a planarization stop; and
   further planarizing to remove the plurality of hard mask lines and to stop substantially at the plurality of fins.

4. The method of claim 1 wherein etching the semiconductor substrate comprises etching the semiconductor substrate to form fins having a height of 40-100 nm and a width of 10-20 nm.

5. The method of claim 1 wherein etching the oxide comprises etching the oxide to expose 10-30 nm of the plurality of fins.

6. The method of claim 1 wherein filling the trenches comprises:
depositing a trench liner;
depositing a gap fill oxide overlying the trench liner;
planarizing the gap fill oxide and stopping the planarization on the isolation hard mask;
etching the gap fill oxide to recess the gap fill oxide to substantially the height of the oxide between the plurality of fins; and
removing the isolation hard mask.

7. The method of claim 1 further comprising:
forming a gate insulator overlying the at least a portion of at least one of the plurality of fins; and
forming a gate electrode overlying the gate insulator.

8. The method of claim 7 further comprising impurity doping source and drain regions in the at least a portion of at least one of the plurality of fins in self alignment with the gate electrode.

9. A method for fabricating a FinFET integrated circuit comprising:
providing a semiconductor substrate divided into a plurality of chip areas;
etching the semiconductor substrate to form a plurality of fins extending across each chip area;
forming isolation between adjacent ones of the plurality of fins;
oxidizing the plurality of fins;
etching through the plurality of fins and into the semiconductor substrate to form trenches in the semiconductor substrate and to divide the plurality of fins into fins of predetermined length; and
filling the trenches with insulating material, wherein filling the trenches comprises:
depositing a trench liner;
depositing a gap fill oxide overlying the trench liner;
planarizing the gap fill oxide; and
etching the gap fill oxide to recess the gap fill oxide to substantially the height of the isolation between the plurality of fins.

10. The method of claim 9 wherein etching the semiconductor substrate comprises:
forming a silicon nitride hard mask overlying the semiconductor substrate; and
anisotropically etching the semiconductor substrate using the hard mask as an etch mask.

11. The method of claim 10 wherein forming isolation comprises:
depositing a layer of oxide overlying the plurality of fins;
planarizing the layer of oxide by chemical mechanical planarization and stopping the planarization on the hard mask; and
etching the planarized layer of oxide to recess the top of the oxide below the top of the plurality of fins.

12. The method of claim 10 wherein forming isolation comprises:
depositing a layer of oxide overlying the plurality of fins;
planarizing the layer of oxide and removing the hard mask by chemical mechanical planarization and stopping the planarization at the top of the plurality of fins; and
etching the planarized layer of oxide to recess the top of the oxide below the top of the plurality of fins.

13. The method of claim 9 further comprising forming gate structures overlying the fins of predetermined length.

14. A method for fabricating a FinFET integrated circuit comprising:
providing a semiconductor substrate divided into a plurality of chips, each chip bounded by scribe lines;
etching the semiconductor substrate to form a plurality of fins, each of the plurality of fins extending across the width of the chips substantially to the scribe lines;
depositing an oxide to fill between the fins;
etching the oxide to recess the oxide;
depositing and patterning an isolation hard mask overlying the plurality of fins;
etching the semiconductor substrate using the isolation hard mask as an etch mask to form trenches in the semiconductor substrate defining a plurality of active areas, each of the plurality of active areas including at least a portion of at least one of the fins; and
filling the trenches with an insulating material to isolate between adjacent ones of the plurality of active areas, wherein filling the trenches comprises:
depositing a trench liner;
depositing a gap fill oxide overlying the trench liner;
planarizing the gap fill oxide and stopping the planarization on the isolation hard mask;
etching the gap fill oxide to recess the gap fill oxide to substantially the height of the oxide between the plurality of fins; and
removing the isolation hard mask.

15. The method of claim 14 wherein etching the semiconductor substrate comprises:
depositing and patterning a layer of hard mask material to form a plurality of hard mask lines having substantially uniform pitch and spacing;
anisotropically etching the semiconductor substrate using plurality of hard mask lines as an etch mask to form the plurality of fins.

16. The method of claim 15 wherein depositing an oxide comprises:
depositing a layer of oxide overlying the plurality of hard mask lines and the plurality of fins and filling between the plurality of fins;
planarizing the layer of oxide using the plurality of hard mask lines as a planarization stop; and
further planarizing to remove the plurality of hard mask lines and to stop substantially at the plurality of fins.

17. The method of claim 14 wherein etching the semiconductor substrate comprises etching the semiconductor substrate to form fins having a height of 40-100 nm and a width of 10-20 nm.

18. The method of claim 14 wherein etching the oxide comprises etching the oxide to expose 10-30 nm of the plurality of fins.

19. The method of claim 14 further comprising:
forming a gate insulator overlying the at least a portion of at least one of the plurality of fins; and
forming a gate electrode overlying the gate insulator.

20. The method of claim 19 further comprising impurity doping source and drain regions in the at least a portion of at least one of the plurality of fins in self alignment with the gate electrode.

* * * * *